US006218892B1

(12) United States Patent
Soumyanath et al.

(10) Patent No.: US 6,218,892 B1
(45) Date of Patent: Apr. 17, 2001

(54) DIFFERENTIAL CIRCUITS EMPLOYING FORWARD BODY BIAS

(75) Inventors: Krishnamurthy Soumyanath; Ali Keshavarzi, both of Portland; Vivek K. De; Shekhar Y. Borkar, both of Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/256,842

(22) Filed: Feb. 24, 1999

Related U.S. Application Data

(63) Continuation-in-part of application No. 08/880,047, filed on Jun. 20, 1997, now Pat. No. 6,166,584, and a continuation-in-part of application No. 09/078,432, filed on May 13, 1998, now Pat. No. 6,100,751.

(51) Int. Cl.[7] ....................................................... G05F 1/10
(52) U.S. Cl. .............................................. 327/537; 327/65
(58) Field of Search ................................. 327/52, 65, 89, 327/534, 537, 530

(56) References Cited

U.S. PATENT DOCUMENTS 5,814,899 * 9/1998 Okumura et al. ....................... 307/64

5,905,402 * 5/1999 Kim et al. .............................. 327/536

OTHER PUBLICATIONS

Wann et al., CMOS with Active Well Bias for Low–Power and RF/Analog Applications, 2000 Symposium on VLSI Technology Digest of Technical Papers, pp. 158–159.*

PCT International Application Number WO 98/59419 dated Dec. 30, 1998, 54 pages.

* cited by examiner

*Primary Examiner*—Jung Ho Kim
(74) *Attorney, Agent, or Firm*—Alan K. Aldous

(57) ABSTRACT

In some embodiments, the invention includes circuit having a differential amplifier and body bias control circuitry. The differential amplifier includes a differential pair of first and second FET transistors to at least partially control output voltage signals responsive to input voltage signals, the first and second FET transistors being configured to be matched and having a body. The body bias control circuitry provides a body bias voltage signal to the body to place the first and second FET transistors in a forward body bias condition. The differential amplifier and body bias circuitry may be used in a sense amplifier, comparator, voltage controlled oscillator, delay locked loop, and phase locked loop as well as other circuits.

30 Claims, 9 Drawing Sheets

DIFFERENTIAL CIRCUITS EMPLOYING FORWARD BODY BIAS

RELATED APPLICATIONS

This application is a continuation-in-part of application Ser. No. 08/880,047, filed Jun. 20, 1997, now U.S. Pat. No. 6,166,584, and a continuation-in-part of application Ser. No. 09/078,432, filed May 13, 1998, U.S. Pat. No. 6,100,751.

BACKGROUND OF THE INVENTION

1. Technical Field of the Invention

The present invention relates to circuits and, more particularly, to circuits including a differential amplifier with a differential transistor pair having a forward body bias.

2. Background Art

Differential amplifier circuits receive two input signals and provide output signals which are a function of a difference of the input signals. For example, the voltage difference in the output signals may be a function of the voltage difference in the input signals. In this way, the differential amplifier suppresses or rejects voltages which are included in both input signals. Examples of the suppressed voltages include a DC offset voltage and noise appearing on both input signals. This suppression is referred to as common mode rejection.

As an example, in one type of differential amplifier in the prior art, the differential amplifier includes first and second n-channel field effect transistors (nFET transistors), referred to as a differential pair. Input signals Vin+ and Vin− are received at the gates of the first and second nFET transistors, respectively. A first load is included between the drain of the first nFET transistor and a power supply. A second load is included between the drain of the second nFET transistor and the power supply. Output signals Vout+ and Vout− are at the drains of the first and second nFET transistors, respectively. The sources of the first and second nFET transistors are jointly coupled to ground through a third nFET transistor. If the first and second loads are matched and the first and second nFET transistors are matched, the difference between Vout+ and Vout− is a function of the difference between Vin+ and Vin−. Mismatches of transistor characteristics (called transistor mismatch) can reduce the accuracy of that function and ability of the amplifier to be sensitive to a small difference between Vin+ and Vin−.

In an integrated circuit, the line width Lmin is the minimum conductor width that can be accurately drawn by the lithographic equipment. For example, in much current lithographic equipment, Lmin is about 0.25 microns. The minimum will continue to get smaller for the foreseeable future.

In the process of applying conductors, there are slight variations in line width. The channel length of a transistor is related to the line width of the gate conductor, called the gate length. Variations in gate length can result in transistor mismatch. For example, referring again to the differential pair, if the channel length of the first nFET transistors is different from the channel length of the second nFET transistor, there may be mismatch between the transistors. A transistor mismatch may result in the difference between Vout+ and Vout− not accurately reflecting the difference between Vin+ and Vin−.

As the dimensions continue to get smaller, the percent difference between variations of the actual line width and the target line width is greater. Likewise, the percent difference in the actual channel length (Lactual) and target channel length (Ltarget) is greater.

One solution is too make Ltarget for the differential pair substantially larger than Lmin. For example, Ltarget may be 3 to 5 times greater than Lmin. Then, any variations in the line width will be relatively small in comparison to the actual line width and the mismatch will be relatively small. As mentioned, the channel length of a transistor is related to line width, however, there may be additional parameter variations in the actual channel length. A problem with making Ltarget much greater than Lmin is that switching speed of the transistors is inversely related to the channel length.

SUMMARY

In some embodiments, the invention includes circuit having a differential amplifier and body bias control circuitry. The differential amplifier includes a differential pair of first and second FET transistors to at least partially control output voltage signals responsive to input voltage signals, the first and second FET transistors being configured to be matched and having a body. The body bias control circuitry provides a body bias voltage signal to the body to place the first and second FET transistors in a forward body bias condition.

The differential amplifier and body bias circuitry may be used in a sense amplifier, comparator, voltage controlled oscillator, delay locked loop, and phase locked loop as well as other circuits.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

A. Differential Amplifiers with Forward Body Bias

Figure 1:
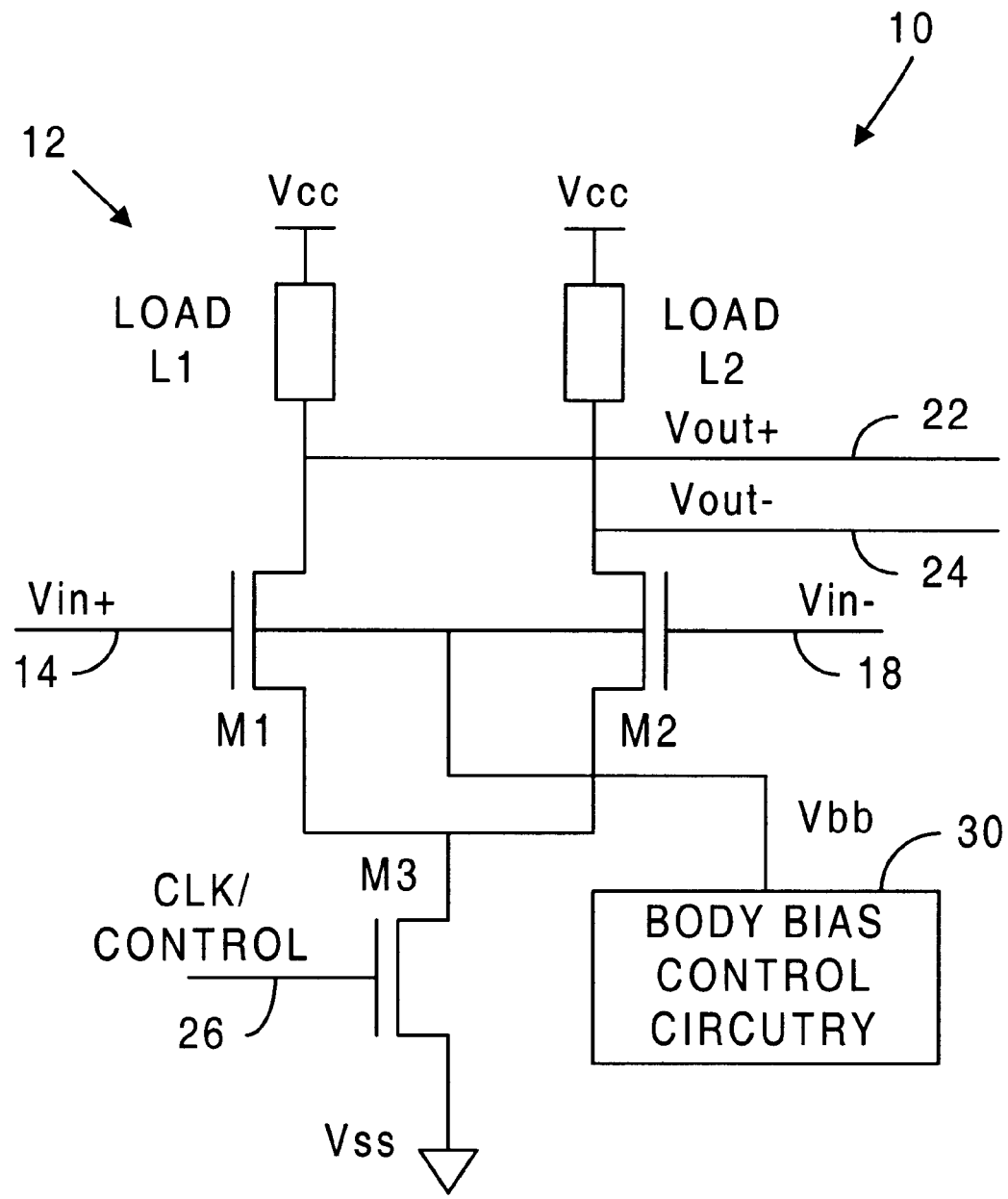
FIG. 1 is a schematic representation of a circuit with a differential amplifier according to some embodiments of the invention.

Referring to FIG. 1, a circuit 10 includes a differential amplifier 12 and body bias control circuitry 30. Differential amplifier 12 includes a differential pair of nFET transistors M1 and M2, which may be metal oxide semiconductor field effect transistors (MOSFET) transistors. The gates of nFET transistors M1 and M2 receive input signals Vin+ and Vin− on input conductors 14 and 18, respectively. Output signals Vout+ and Vout− are provided on output conductors 22 and 24, which are coupled to the drains of transistors M1 and M2, respectively. The difference between Vout+ and Vout− is a function of the difference between Vin+ and Vin−. (Note that the output signals may be inverted with respect to + and −.). Loads L1 and L2 are positioned between supply voltage Vcc and the drains of nFET transistors M1 and M2, respectively. Loads L1 and L2 may be transistors, resistors or other devices. An nFET transistor M3 (a control circuit) provides a path to ground (Vss). In some embodiments, a signal at the gate of control transistor M3 is a clock signal (CLK). In other embodiments, the signal at the gate of control transistor M3 is a voltage control signal, such as an analog control signal. In still other embodiments, the gate may be tied high.

The terms "some embodiments" and "other embodiments" mean that at least some embodiments of the invention include the structure, function, or characteristic referred to in connection with the term. Further, the different references to "some embodiments" are not necessarily all referring to the same embodiments.

Vin+ and Vin− may be analog or digital signals. As an example, differential amplifier 12 may be useful in receiving small analog input signals and providing full rail output signals. The voltages of the input signals Vin+ and Vin− may be smaller in comparison with Vcc or comparable or equal to Vcc. The amplification may be greater than 1, equal to 1, or less than 1, and inverted in each case. The invention is not restricted to the particular details of differential amplifier 12. Various other differential amplifier designs may be used.

The "offset voltage" of a differential amplifier is a measure of how closely the difference between Vout+ and Vout− accurately reflects the difference between Vin+ and Vin−. One measure of the offset voltage is the difference between Vin+ and Vin− that results in Vout+ equaling Vout−. Another measure of the offset voltage is the difference between Vout+ and Vout− when Vin+ equals Vin−. The ability of a differential amplifier to amplify small signals is limited by the offset voltage. That is, the amplifier may not be able to have sensitivity to signals with a difference smaller than the offset voltage.

Body bias control circuitry 30 provides a body bias signal Vbb to bodies of transistors M1 and M2. This is in contrast to the prior art wherein the bodies of the differential transistor pair are tied to their sources (which typically are at or near ground). Control circuitry 30 may also provide forward body bias to other transistors in circuit 10, including those not shown. The level of body bias to M1 and M2 as well as other transistors may remain constant or change depending on the mode of the circuit 10. Body bias refers to the relationship between voltage of the source (Vsource) and the voltage of the body (Vbb) of a FET transistor. The following chart summarizes types of body biases depending on Vsource and Vbb of a transistor in a typical configuration. In an n-channel FET transistor (nFET transistor), the source is of the "n" type and the body is of the "p" type. In a p-channel FET transistors (pFET transistor), the source is of the "p" type and the body is of the "n" type. The Vbb applied to the p-type body of an nFET transistor is referred to as Vbbp. The Vbb applied to the n-type body of a pFET transistor is referred to as Vbbn. Zero body bias and reverse body bias are examples of non-forward body biases.

| Transistor | Bias | Body Bias Voltage | n v. p |
|---|---|---|---|
| nFET | Forward | Vbbp > Vsource | p > n |
| nFET | Zero | Vbbp = Vsource | p = n |
| nFET | Reverse | Vbbp < Vsource | p < n |
| pFET | Forward | Vbbn < Vsource | p > n |
| pFET | Zero | Vbbn = Vsource | p = n |
| pFET | Reverse | Vbbn > Vsource | p < n |

As Vbbp increases or Vbbn decreases with respect to Vsource, the threshold voltage (Vt) of the transistor is decreased. Conversely, as Vbbp decreases or Vbbn increases with respect to Vsource, the threshold voltage is increased. For example, the threshold voltage is less with a forward bias than with a zero bias. The switching speed is increased with a lower threshold voltage and decreased with a higher threshold voltage. The leakage power consumption is higher with a smaller threshold voltage and lower with a higher threshold voltage. The active power consumption may also be affected by body bias. A lower threshold allows a higher clock rate which results in more active power.

Figure 2:
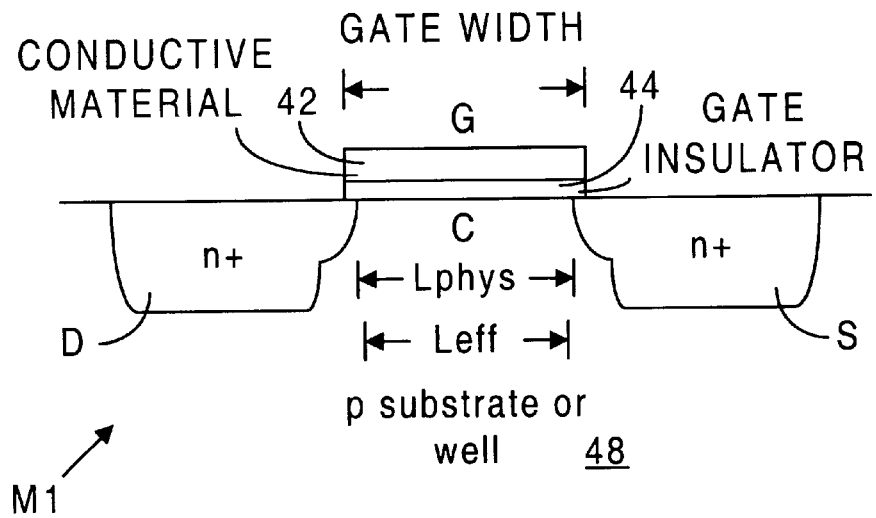
FIG. 2 is a schematic representation of a cross-section of transistor M1 of FIG. 1 according to some embodiments of the invention.

Referring to FIG. 2, a schematic cross-section representation nFET transistor M1 according to some embodiments includes a source (S), drain (D), and gate (G). FIG. 2 also represents M2. A channel (C) is formed between the source and drain when certain voltages are applied. Ideally, current does not pass between the source and drain unless the gate to source voltage Vgs exceeds a threshold voltage Vt. The channel is formed in the p type material of a substrate or well 48. The material below the channel and in which the drain and source are formed is referred to as the body. The gate includes a conductive material 42, such as a polysilicon, separated from the channel through a gate insulator 44, such as a gate oxide (e.g., SiO2). Additional insulation (not shown) may be positioned around the gate. FIG. 2 is schematic in nature and provided for purposes of discussion, not to illustrate precise shapes or relative sizes. Indeed, the invention is not restricted to any particular type of FET transistor. For example, the source and drain extensions illustrated in FIG. 2 are not required. The source and drain are illustrated overlapping the gate, but are not required to. Angled implants may be used.

The term Lmin refers to the minimum line width that can be supported by the fabrication equipment (e.g., lithography). There is also a minimum physical channel length that is related to Lmin. Conductive material 42 is applied with a target gate length (or line width). There is a minimum target line width that will be supported by the equipment used in fabrication (e.g., lithographic equipment). The gate length may be at or greater than Lmin.

There are at least two measures of channel length: physical channel length (Lphy) and effective electrical channel length (Leff). To a first order, Lphy is equal to the gate length minus the amount by which the source and drain overlap the gate. To a first order, Leff is equal to Lphy minus the depletion regions amount of the diffusion of the source and drain into the channel. Transistor M1 may include spacers on each side of the gate.

Ltarget is the target physical channel length. The difference between Lphysical and Ltarget is due to unintentional parameter variations. The Lphy and Leff may vary due to various parameter variations including the difference between Lactual and Ltarget gate lengths and variations in the placement of the source and drain. However, a larger Lphy leads to better matching because with constant parameter variations, the percent difference between Lphys and Ltarget is smaller as Ltarget is larger.

The mismatch between M1 and M2 may be reduced by increasing the gate length, Lphys, and Leff. In the prior art, for example, Lphys might be 3 to 5 or more times larger than Lmin. However, the switching speed of the transistor is slower with a larger Leff caused at least in part through raising the threshold voltage Vt. The present invention involves the discovery that applying a forward body bias reduces the variations in threshold voltage as a function of Lphys. It is believed that a reason why variations in the threshold voltage are reduced is that the lateral diffusion region in the channel is made smaller through forward body bias, thereby, increasing Leff without increase Lphys. (The actual physics may be somewhat more complicated, but a discussion of it is not required here.)

Figure 3:
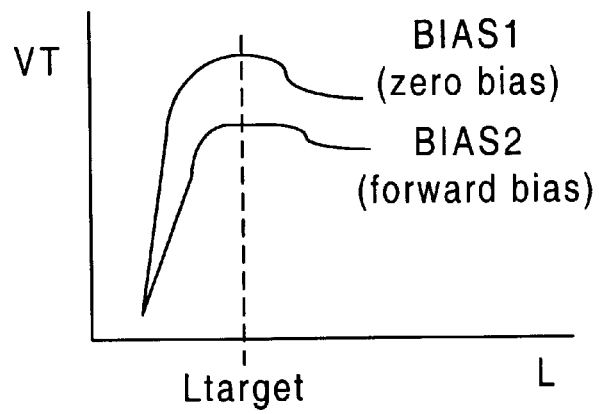
FIG. 3 is a generalized graphical representation of VT v. L at two different body biases.

FIG. 3 illustrates a possible general relationship between threshold voltage Vt vs. L, where L may represent gate length, Lphys, or Leff, for body bias1 and body bias2, where body bias2 is more forward than body bias1. FIG. 3 is not intended to show precise curves, but rather to only illustrate that with bias1, the curve is steeper and with bias 2, the curve is more shallow and flatter. Actual curves may look somewhat different. An example of an Ltarget is shown, but Ltarget can be in other locations.

Figure 4:
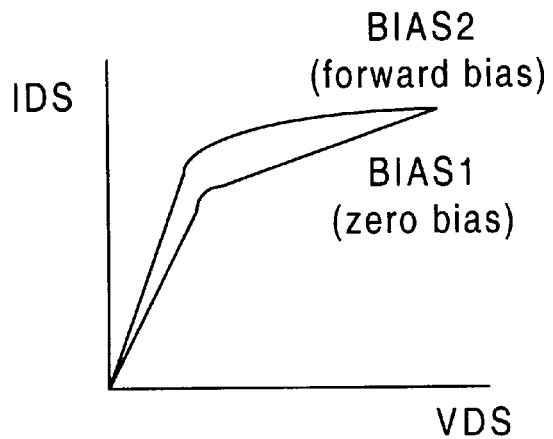
FIG. 4 is a generalized graphical representation of IDS v. VDS at two different body biases.

FIG. 4 illustrates possible general curves for Ids v. Vds, where Ids is drain to source current and Vds is drain to source voltage. FIG. 4 is not intended to show precise curves but to illustrate that with body bias2, which is more forward than body bias 1, the curve is flatter, indicating better short channel effects (SCE). Actual curves could look somewhat different.

Not only does applying forward body bias to a differential pair improve matching, but it may also increase the gain Av. The gain Av=gm/gds, where gm is the transconductance and gds is the output conductance. With forward body bias, gm increases and gds decreases along with the improved SCE. Gm is proportional to $\delta Ids/\delta Vgs$. The drain to source current $Ids=W/L \mu (Vgs-Vt)^\alpha$, where W is the channel width, L is the channel length, $\mu$ is a constant, Vgs is the gate to source voltage, Vt is the threshold voltage, and $\alpha$ is about 1.1 in some embodiments. Ids increases with a smaller Vt.

The threshold voltage of a FET becomes more sensitive to channel length variations as the channel length variations becomes smaller. By using forward body bias, the FETs are less sensitive to variations in channel length. Therefore, a given level of acceptable mismatch can be achieved with a smaller target gate length or Lphys by using forward body bias, than would be achieved without forward body bias. From another perspective, improved (reduced) mismatch can be achieved at a given target gate length or Lphys channel by using forward body bias, than would be achieved without forward body bias. As examples, with forward body bias, either the gate length and Lphy could be less than 2 Lmin (e.g., $\leq 1.5$ Lmin, $\leq 1.25$ Lmin, =Lmin), where Lmin is, for example, $\leq 0.18$ micron, $\leq 0.13$ micron, $\leq 0.10$ micron.

Forward body bias improves short channel effects (SCE) as measured by the ratio Idsat/Vds, for a given body bias level, where Idsat is the saturation drain current and Vds is the drain to source voltage. SCE in the analog context means that the slope of the Vds vs. Ids characteristic is increased, thus reducing the device output impedance when Idsat is increased, where Ids is the drain to source current. This degrades the achievable gain of amplifiers. Consequently, the increasing SCE of, for example, sub 0.1 micron line width technologies is a limitation in the improvement of amplifier gain. Because, forward body bias improves SCE (as compared to a zero or reverse body bias), this enables transistors with low Vt and good SCE in these technology generations. The reduction of SCE results in an improvement in the output impedance of high transconductance MOS transistors. Thus, for a given body bias condition, a device using forward body bias will generally show higher small signal gain (higher transconductance multiplied by a less degraded output impedance), at higher frequencies than one that does not.

Forward body bias reduces variations in transistor parameters which leads to better matching of input differential pairs with a low offset voltage at a high drive current capability. As mentioned, forward body bias applied to differential pair FET transistors improves the sensitivity of threshold voltage to channel length variation. Consequently, there can be greater parameter variation while retaining a particular level of matching. Examples of device parameters improved with forward body bias include: Vt (threshold voltage), IOFF (leakage current), and Idsat (drain saturation current). Forward body bias improves parameter variation which means that generally for a given target channel length Lphys, the differential pair using forward body bias will be better matched (in Vt, IOFF, and Idsat) than those that do not use forward body bias. This will result in a lower offset voltage for the differential pair with attendant improvement in noise tolerance and reduced harmonic distortion. The differential amplifier may provide satisfactory results at well over 1 GHz operating frequencies.

Prior to the present invention, the benefits of applying forward body bias to the differential pair of a differential amplifier were not appreciated. Notwithstanding these benefits, those skilled in the art have not designed circuits in which a forward body bias was applied to the differential pair.

Figure 5:
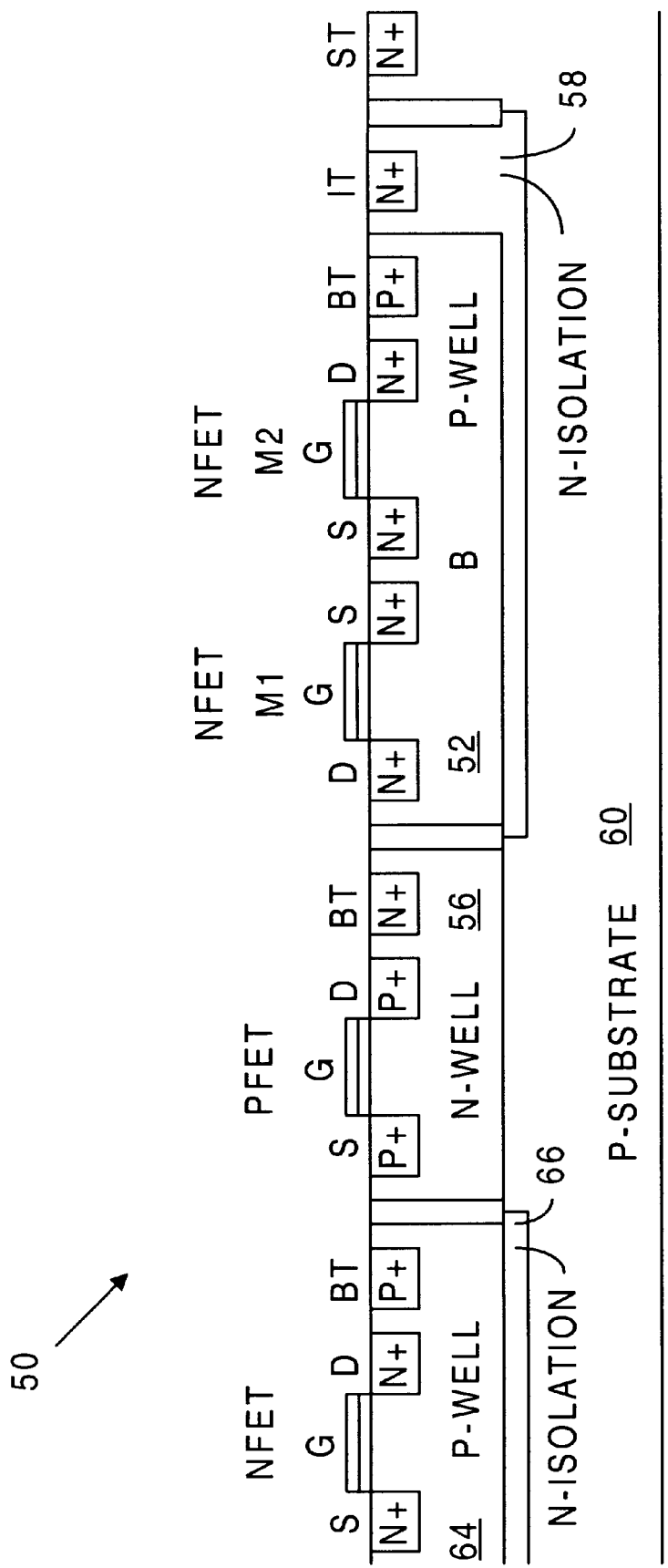
FIG. 5 is a schematic representation of a cross-section of some transistors of FIG. 1 according to some embodiments of the invention.

FIG. 5 is a schematic representation of a cross-section of a portion of die 50 on which some embodiments of circuit 10 of FIG. 1 are formed. In the example of FIG. 4, nFET transistors including differential pair nFET transistors M1 and M2 are formed in a p-well 52. nFET transistors M1 and M2 share a body (B) in p-well 52. PFET transistors are formed in an n-well 56. Other nFET transistors are formed in another p-well 64. Only representative transistors are illustrated in the wells and there may be additional wells. Transistor M3 may be in p-well 52 or 64 or not in a well. Body taps (BT) are used to provide a body bias, which may be forward, reverse, or zero and which may change depending on the mode the die is in at any particular time. An isolation tap (IT) allows a voltage bias for n-isolation layer 58. A substrate tap (ST) allows a voltage for p-substrate 60. (The substrate could be biased from the backside of the substrate. Bias could be applied in a variety of other portions of the chip.) The invention is not restricted to the die of FIG. 4, but rather various other arrangement may be used. For example, wells and n-isolation layers 58 and 66 are not necessary, but (along with lateral isolators) allow the body bias of p-wells to not affect or be affected by other bias voltages.

In addition to the differential amplifiers described above, the invention may be employed in a variety of other circuits.

B. Sense Amplifiers

Figure 6:
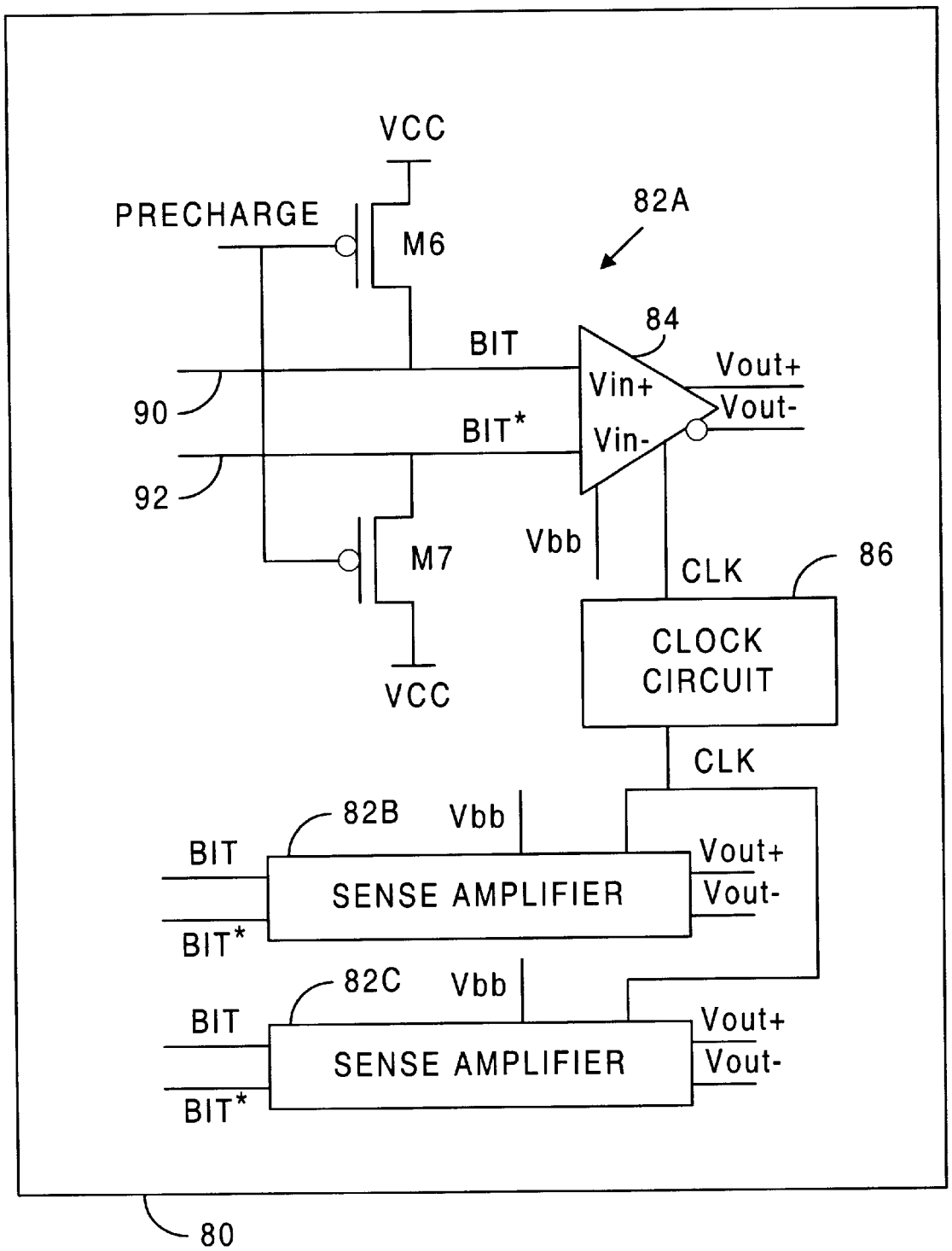
FIG. 6 is a schematic representation of a sense amplifier according to some embodiments of the invention.

In some embodiments, forward body bias is applied to a differential amplifier in a sense amplifier. Circuits according to the invention may include one or more such sense amplifiers. Referring to FIG. 6, as an example, an integrated circuit 80 includes sense amplifiers, of which sense amplifiers 82A, 82B, and 82C are illustrated. Sense amplifier 82A is representative of the other sense amplifiers. Sense amplifier 82A includes a differential amplifier 84, which may be the same as, similar to, or somewhat different than differential amplifier 12 in FIG. 1. Differential amplifier 84 may be one that is known in the art, except that is receives a forward bias signal. A clock signal is applied to differential circuit 84. For example, if differential amplifier 84 is the same as differential amplifier 12, then the clock signal may be applied to the gate of transistor M3 of differential amplifier 12.

In a precharge phase, a precharge signal is low at the gates of pFET transistors M6 and M7, which are examples of precharge circuitry, so that bit and bit* lines are pulled to the supply voltage Vcc. In a sensing phase, the precharge signal goes high. Differential amplifier 84 senses the difference between the state of the bit and bit* lines, where, for example, the bit line is received as the Vin+ signal and the bit* line is received as the Vin− signal. The voltages of Vout+ and Vout− are functions of Vin+ and Vin− as, for example, described above in connection with FIG. 1.

The performance of sense amplifier 82A may be improved by applying forward body bias to the differential pair in differential amplifier 84 because, as described above, it improves matching resulting in a reduced offset voltage. For those cases in which the difference in Vin+ and Vin− is small, sense amplifier 82A cannot detect differences less than the offset voltage. By reducing the offset voltage, the precision of sensing is enhanced. Also, the speed of the sense amplifier is limited by the offset voltage because in those cases in which the difference in Vin+ and Vin− transitions from being very small to being larger, the transition will not be known until the difference is greater than the offset voltage. There will be an increase in sensing speed in those cases in which the timing of the sensing phase is such that sensing occurs shortly after the difference, if one develops, would be greater than the offset voltage. Through forward body bias, the offset voltage can be less, so that the sensing speed can be greater. Clock circuitry 86 controls the clock signal (CLK) provided to differential amplifier 84 and may set the clock frequency so as to take advantage of the lower offset voltage provided as a result of the forward body bias.

In some embodiments, body bias control circuitry 30 always provides the same Vbb, at least while a functional unit block in which the sense amplifier resides is operational. In other embodiments, the body bias control circuitry may provide a different value of Vbb at different times. For example, in high performance mode, Vbb may be set to allow a higher performing sensing amplifier. During the high performance mode, clock circuit 86 may increase the clock frequency to take advantage of the lower offset voltage of the differential pair. In a lower performance, power saving mode, the Vbb may be set to make a reverse, zero, or less forward bias to conserve power. The clock frequency may also be lowered. In some embodiments, the supply voltage is higher in a high performance mode and lower in a lower power mode.

In some embodiments, both the bit and bit* lines can change state (such in the case in which conductors 90 and 92 are connected to cells of a static random access memory (SRAM). Alternatively, one of the bit or bit* lines may be held, while the other is allowed to change. Integrated circuit 80 may be a processor, such as a microprocessor or digital signal processor, which may include memory cells, a separate memory device, or various other types of integrated circuits. Integrated circuit 80 may include the other circuits illustrated and described in this disclosure. The invention is not limited to the particular details illustrated in connection with FIG. 6, but various other sense amplifier designs having a forward body biased differential pair may be used.

C. Comparators

Figure 7:
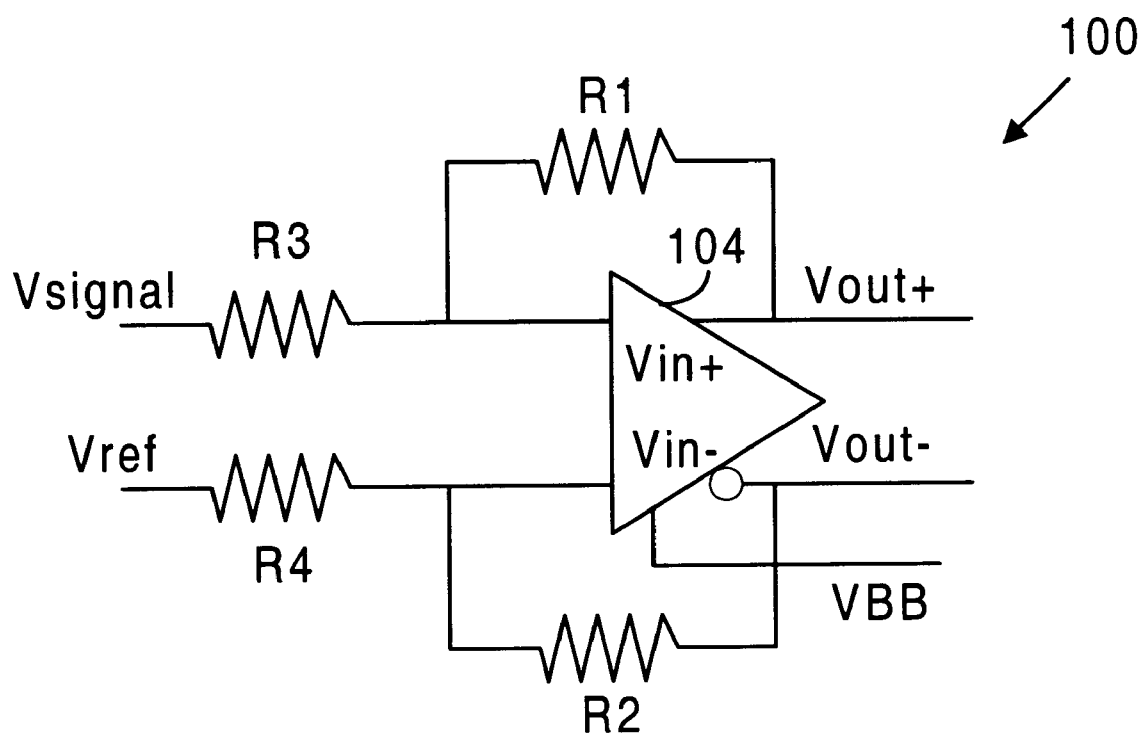
FIG. 7 is a schematic representation of a comparator according to some embodiments of the invention.

In some embodiments, a circuit according to the invention includes one or more comparators. For example, referring to FIG. 7, a comparator 100 includes a differential amplifier 104, which may be the same as, similar to, or somewhat different that differential amplifier 12. The gain is controlled by the ratio of feedback resistors R1 and R2. When Vin+ and Vin− are the same voltage, the difference between Vout+ and Vout− should be zero. In fact, to a first order, the difference between Vout+ and Vout− is Av*Voffset, where Av is voltage gain of the comparator and Voffset is the offset voltage of the differential amplifier. Through application of forward body bias (through the Vbb signal), the differential pair transistors are better matched and the offset voltage is reduced. Resistors R3 and R4 might also be matched. The gain and offset voltage of the comparator are improved. Comparator 100 could include a clock signal as in FIG. 6.

D. Differential Voltage Controlled Oscillators

Figure 8:
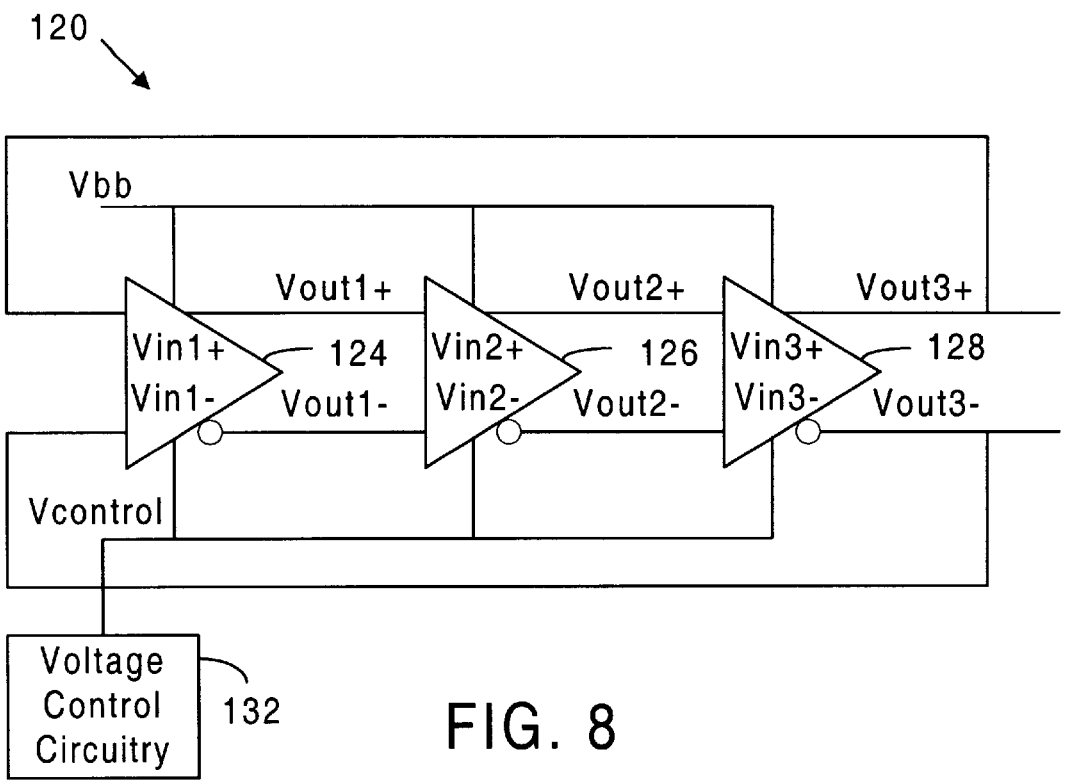
FIG. 8 is a schematic representation of differential voltage controlled oscillator according to some embodiments of the invention.

The amount of body bias voltage can be used to at least partially control the frequency of a differential voltage control oscillator (VCO). The differential VCOs may have an even number or an odd number of differential amplifier stages. For example, referring to FIG. 8, a differential VCO 120 includes an odd number of differential amplifier stages, including differential amplifiers 124, 126, and 128, which may be the same as, similar to, or somewhat different from differential amplifier 12. The differential amplifier stages are coupled together as illustrated. For example, the output signals of differential amplifier 124, Vout1+ and Vout1−, are the input signals, Vin2+ and Vin2−, of differential amplifier 126, as illustrated, etc. The output signals of differential amplifier 128, Vout3+ and Vout3−, are the input signals, Vin1+ and Vin1−, of differential amplifier 124, as illustrated.

A Vbb signal is applied to the body of the differential pairs of the differential amplifiers. (Alternatively, the Vbb signal might be applied to only some of the differential amplifiers.) A voltage control signal (Vcontrol) is also provided to the differential amplifiers to control the frequency of oscillation. (Alternatively, different voltage control signals could be provided to different ones of the differential amplifiers.) For example, if the differential amplifier of FIG. 1 is used for differential amplifies 124, 126, and 128, the Vcontrol signal from voltage control circuitry 132 may be applied to the gate of transistors M3. By selecting a Vbb that results in a forward body bias of the differential transistor pair, the differential pair is more closely matched and has a lower offset voltage. With a lower offset voltage, the differential VCO may support a higher clock frequency of oscillation. The inputs and outputs may be at full-rail or less than full-rail.

As mentioned in connection with sense amplifiers, the body bias control circuitry can apply Vbb with different voltages at different times depending on which mode the circuit is in. Alternatively, a single Vbb can be applied as long as the functional unit block containing the VCO is operational.

Figure 9:
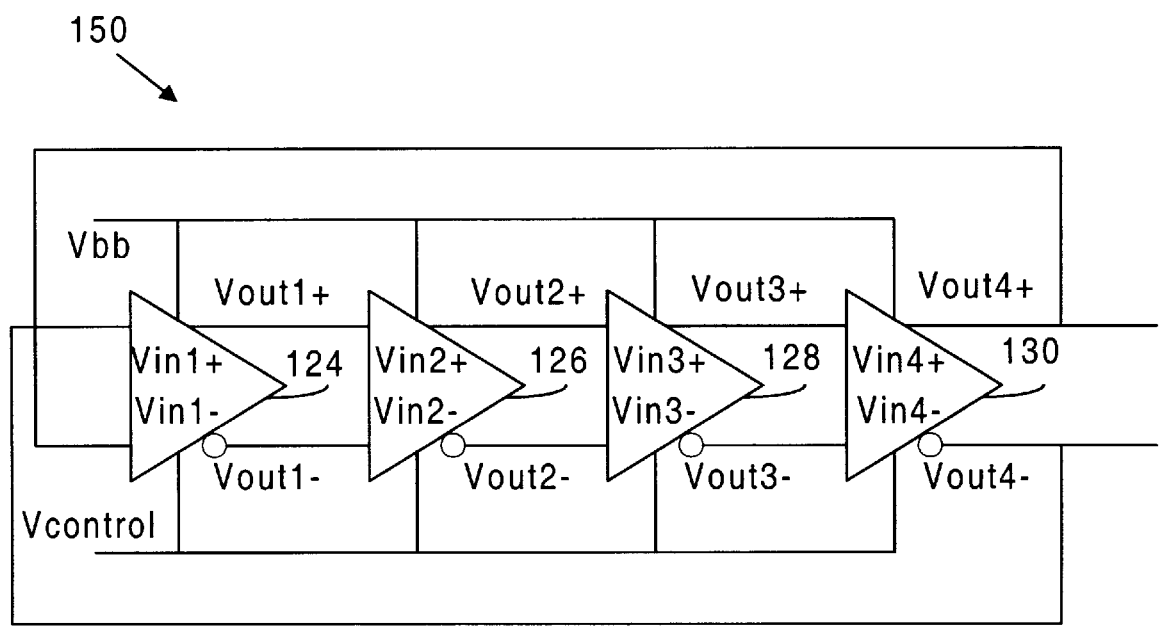
FIG. 9 is a schematic representation of differential voltage controlled oscillator according to some embodiments of the invention.

With an odd number of differential amplifier stages, the differential VCO will oscillate with the Vout+ and Vout− voltage signals of the last output stage being applied as the input voltage signals Vin+ and Vin− of the first stage, as illustrated in FIG. 9. However, with an even number of stages, the output voltage signals Vout+ and Vout− of the last stage are cross-coupled both being applied as the input voltage signals Vin+ and Vin−. For example, output signals Vout4+ and Vout4− of differential amplifier 130 are applied as input signals Vin1− and Vin1+, respectively, as illustrated in FIG. 9. An advantage of having an even number of differential amplifier stages is that quadrature components 90°, 180°, 270°, and 360° can be obtained through tapping at the appropriate location in the differential VCO at, for example, Vout1+ and Vout1−, Vout2+ and Vout2−, Vout2+ and Vout2−, and Vout4+ and Vout4−, respectively. A disadvantage of a differential VCO with an even number of differential amplifier stages is that offset voltages are additive. Accordingly, prior to the present invention, differential VCOs with an even number of stages have tended to not be used because the relative high offset voltage meant that the frequency was fairly limited. However, an aspect of the present invention is the realization that the offset voltage can be reduced through forward body bias. Therefore, the negative effect of an additive offset can be reduced such that differential VCOs with an even number of stages can be made that operate at high frequencies.

E. Delay Locked Loops and Phase Locked Loops

Figure 10:
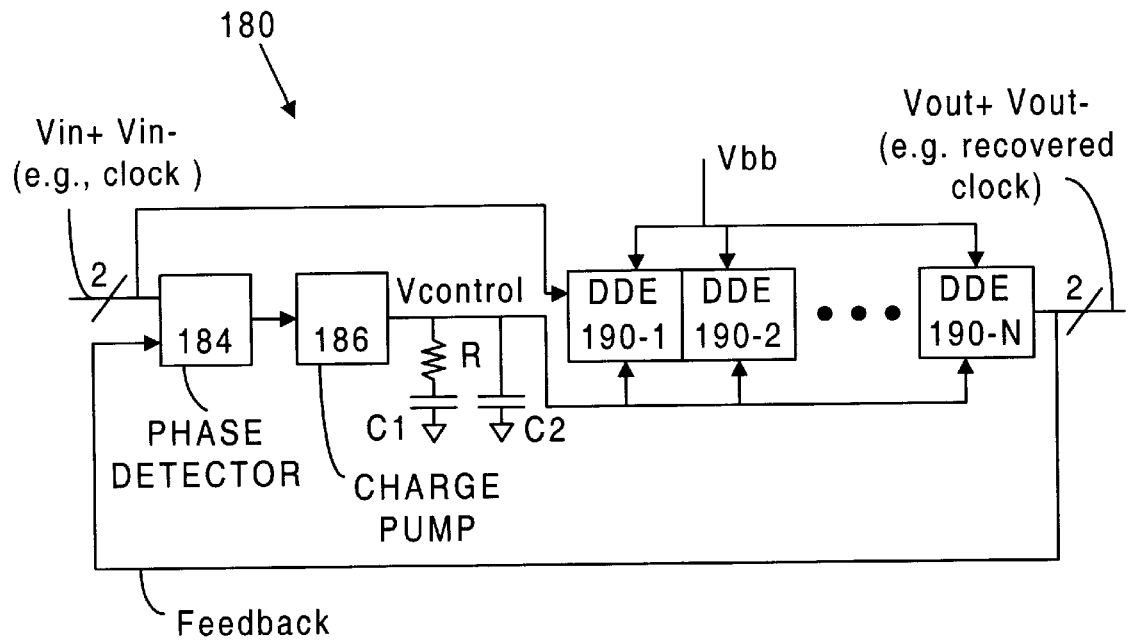
FIG. 10 is a schematic representation of differential delay locked loop according to some embodiments of the invention.

FIG. 10 illustrates a delay locked loop 180 according to some embodiments. Other delay locked loops according to the invention do not have to have the same details as delay locked loop 180. Referring to FIG. 10, a phase detector 184 provides an output signal that is a function of the phase relationship between differential input signals Vin+ and Vin− (which may be a clock signal) and a feedback signal (which may be a recovered clock signal). A charge pump 186 provides a Vcontrol voltage control signal as a function of the output signal of phase detector 184. A loop filter including resistor R1 and capacitors C1 and C2 reduces or eliminates AC signals provided from charge pump 186. The Vcontrol voltage control signal is applied to control circuitry in differential delay elements (DDEs) 190-1, 19-2, . . . , 190-N, wherein the output of one DDE feeds into the input of the next DDE, except that the output signals Vout+ and Vout− of DDE 190-N is the delayed output signals and feedback signal. The number of DDEs may be odd or even. That is, N may be odd or even.

DDEs 190-1, 190-2, . . . 190-N may be the same as, similar to, or somewhat different from differential amplifier 12 in FIG. 1. For example, if DDEs 190-1 . . . 190-N are the same as differential amplifier 12, the Vcontrol signal may be applied to the gate of transistor M3 in FIG. 1. Vin+ and Vin− are applied to differential inputs to DDE 190-1. A body bias signal Vbb is applied to the body of the differential pair and perhaps other transistors. As described above, applying Vbb make the differential pairs less sensitive to parameter variations and allows the differential amplifiers to run at a higher frequency.

Figure 11:
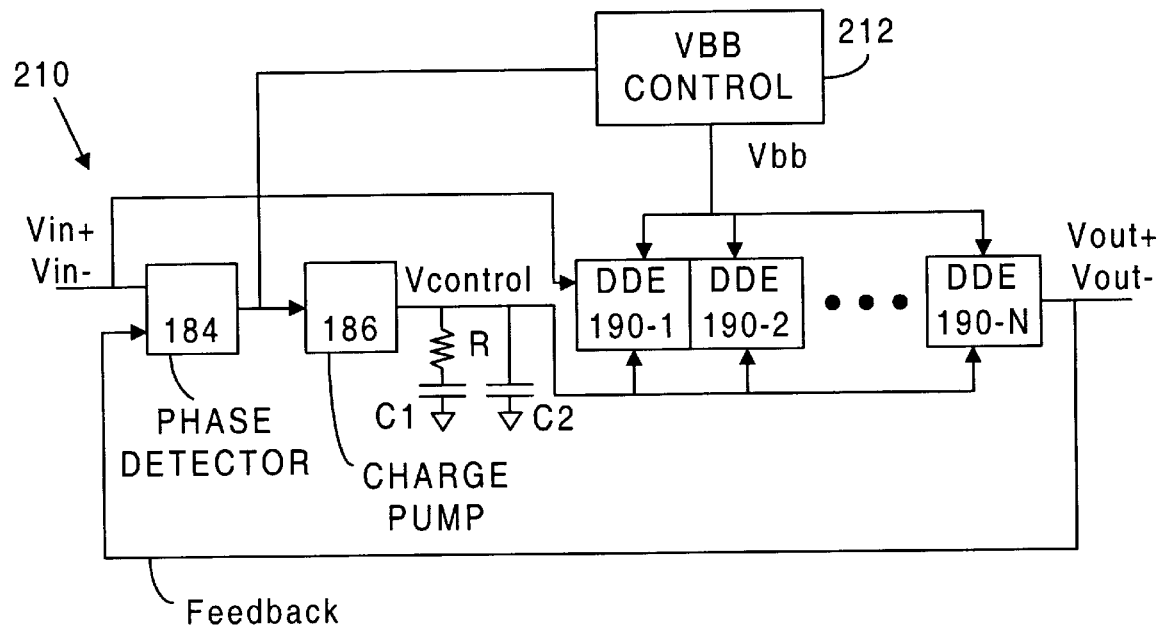
FIG. 11 is a schematic representation of differential delay locked loop according to some embodiments of the invention.

FIG. 11 illustrates a delay locked loop 210, which is similar to delay locked loop 180 except that a Vbb control circuit 212 controls the Vbb voltage signal applied to the bodies of the differential pairs of DDEs 190-1, 190-2, . . . , 190-N in response to a signal from phase detector 184. Vcontrol signal may be thought of as a course grain delay control signal and Vbb may be thought of as a fine grain control signal.

Figure 12:
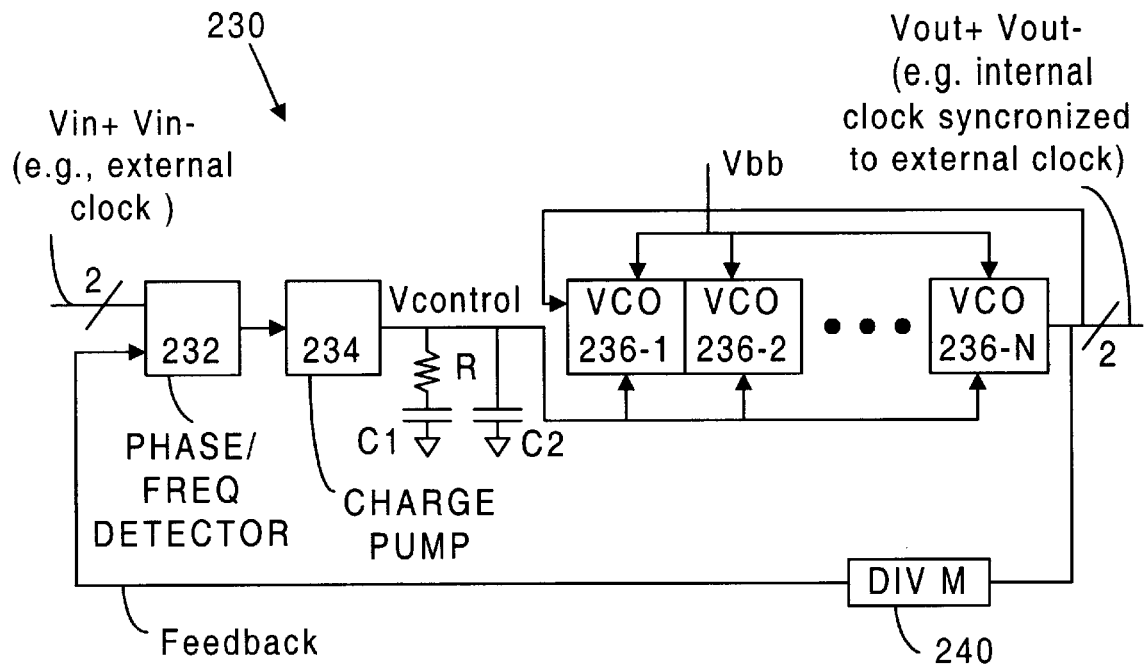
FIG. 12 is a schematic representation of differential phase locked loop according to some embodiments of the invention.

FIG. 12 illustrates a phase locked loop 230 in which a differential input signals Vin+ and Vin− (which may be an external clock signal) and a feedback signal are received by a phase/frequency detector 232. Phase/frequency detector 232 provides output to a charge pump 234 that is a function of the phase and frequency difference between the input signal and the feedback signal. Charge pump 234 provides a Vcontrol signal smoothed by a loop filter (including R, C1, and C2) to control circuits of VCOs 236-1, 236-2, . . . 236-N, like those in FIG. 8 or 9. The number of VCOs may be odd or even. That is, N may be odd or even. The differential output signals Vout+ and Vout− are in phase with the input signals Vin+ and Vin−, but has a frequency that is a multiple M of the input signal. Divide by M circuitry 240 is used to bring the feedback signal to the same frequency as the input signal. Applying the forward body bias allows the transistor pairs to be better matched and the VCOs to be able to run at a higher frequency.

Figure 13:
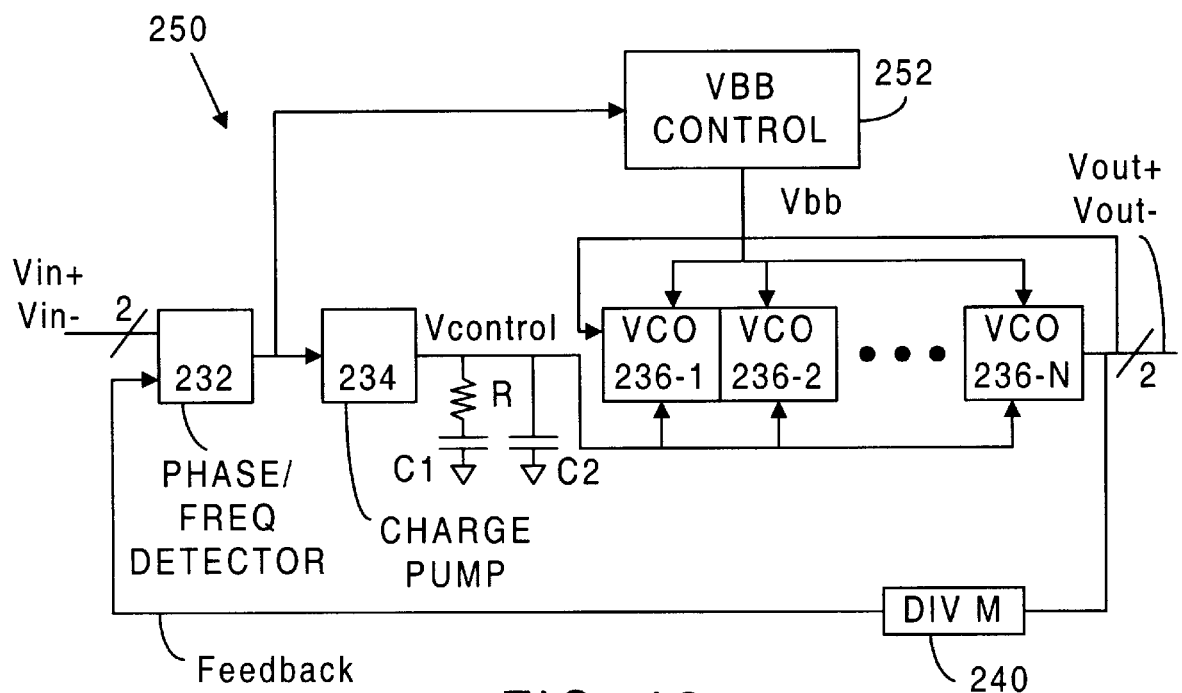
FIG. 13 is a schematic representation of differential phase locked loop according to some embodiments of the invention.
Figure 14:
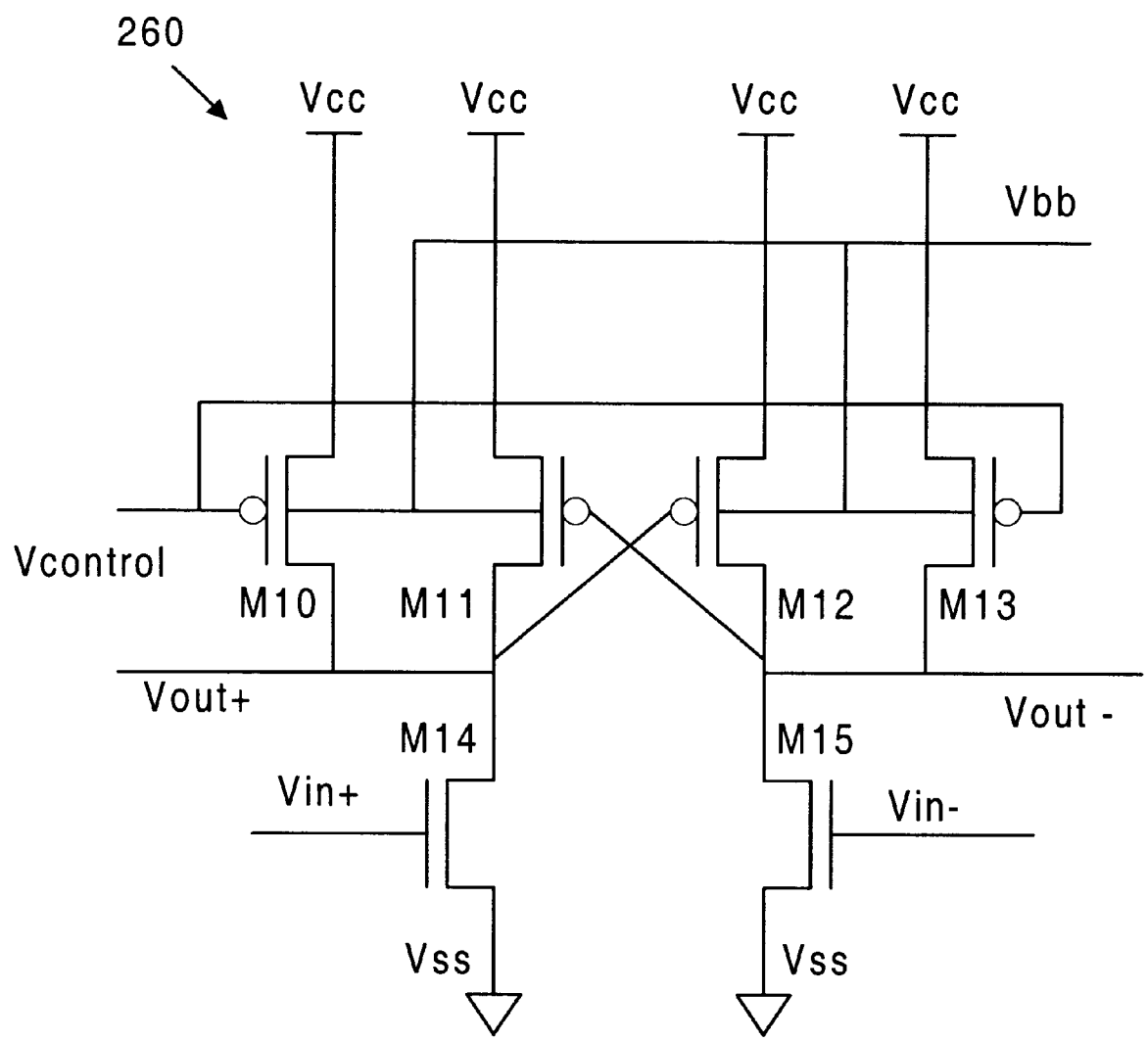
FIG. 14 is a schematic representation of a circuit having a differential amplifier receiving forward body bias.

FIG. 13 illustrates a phase locked loop 250, which is similar to phase locked loop 230 except that a Vbb control circuit 252 controls the Vbb voltage signal applied to the bodies of the differential pairs of VCOs 236-1, 236-2, . . . , 236-N in response to a signal from phase detector 184. Vcontrol signal may be thought of as a course grain control signal and Vbb may be thought of as a fine grain control signal.

F. Additional Information and Embodiments

The optimal level of Vbb will depend on various factors. However, for some embodiments, a Vbb of about 500 millivolts may yield desirable results for the sense amplifiers, comparators, voltage control oscillator circuits, delay locked loops, and phase locked loops described above. A Vbb below 500 millivolts (e.g., about 450 millivolts or between 400 to 500 millivolts) may yield desirable results.

As mentioned, various differential amplifiers other than differential amplifier 12 in FIG. 1 may be used. For example, FIG. 12 illustrates a differential amplifier 260 that may be used in connection with some embodiments of the invention. PFET transistors M10 and M13 act as control circuits and receive a control signal, such as Vcontrol in FIGS. 8–13 or a clock signal. NFET transistors M14 and M15 receive Vin+ and Vin− and Vout+ and Vout− are at the drains of pFET transistors M11 and M12. Vbb is applied to M11 and M12 and may also be applied to M10 and M13.

A differential amplifier with forward body bias may be used with differential mixers, such as for example in connection with the third order intercept point (IP3), and with RF receivers. A differential amplifier may be used to help with the total harmonic distortion of amplifiers and filters. The differential amplifiers with forward body bias may be used in connection with reference circuits.

The circuits described herein can be used in a variety of integrated circuits including processors, such as microprocessors and digital signal processors, and memories such as cache memories, and for intra and inter chip communication.

Applying the right amount of forward body bias can improve output impedance to meet gain requirements without degrading bandwidth. For example, applying 500 mV forward body bias to some transistors significantly improves drain-induced-barrier-lowering drain (and by extension the output impedance). It is believed that a primary reason for this is that forward body bias improves SCE. Applying the right amount of forward body bias can lower sensitivity of Vt change to channel dopant (Vt with respect to Na). Applying the right amount of forward body bias can lower the sensitivity of Vt to temperature change (Vt with respect to T). This may result in improved, temperature invariant, reference circuits at sub 1V power supplies. For a given control Lmin, (for the best 3 sigma control Lmin achievable for a technology), applying forward body bias can be used to lower the target transistor channel length. This may result in higher bandwidth transistors for a given process technology.

In some embodiments, isolating dielectrics is positioned beneath the source and drain to reduced junction capacitance, but does not extend beneath the channel. In other embodiments, there is no isolation. In still other embodiments, an SOI structure may be used.

If the specification states a component, feature, structure, or characteristic "may", "might", or "could" be included, that particular component, feature, structure, or characteristic is not required to be included. The term "responsive" means that if A is responsive to B, some quality of A is at least partially directly or indirectly a function of B.

There may be intermediate structure (such as a buffer) or signals between two illustrated structures or within a structure (such as a conductor) that is illustrated as being continuous. The borders of the boxes in the figures are for illustrative purposes and not intended to be restrictive.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A circuit comprising:
    a differential amplifier including a differential pair of first and second FET transistors to at least partially control output voltage signals responsive to input voltage signals, the first and second FET transistors being configured to be matched and having a body; and
    body bias control circuitry to provide a body bias voltage signal to the body to place the first and second FET transistors in a forward body bias condition.

2. The circuit of claim 1, wherein with the forward body bias applied the first and second FET transistors are better matched and an offset voltage of the differential amplifier is reduced as compared to the matching and offset voltage that would exist with a zero body bias.

3. The circuit of claim 1, wherein the differential amplifier further includes a control transistor coupled to the differential pair and wherein the control transistor being is on as a condition to the differential amplifier being operational.

4. The circuit of claim 1, wherein the input conductors include a first input conductor connected to the gate of the first FET transistor and a second input conductor connected to the gate of the second FET transistor.

5. The circuit of claim 1, wherein the input conductors include a first input conductor coupled to the gate of the first FET transistor and a second input conductor coupled to the gate of the second FET transistor.

6. The circuit of claim 5, wherein the input voltage signal includes a Vin+ signal and a Vin− signal applied to the first and second input conductors, respectively.

7. The circuit of claim 1, wherein the output conductors include a first output conductor connected to the drain of the first FET transistor and a second output conductor connected to the drain of the second FET transistor.

8. The circuit of claim 1, wherein the output conductors include a first output conductor coupled to the drain of the first FET transistor and a second output conductor coupled to the drain of the second FET transistor.

9. The circuit of claim 1, wherein the body bias control circuitry includes a forward body bias mode wherein the body bias voltage signal places the first and second FET transistors in the forward body bias condition and a non-forward body bias mode wherein the body bias voltage signal places the first and second FET transistors in a non-forward body bias condition.

10. The circuit of claim 1, further comprising additional transistors and isolation structure to isolate the first and second FET transistors from at least some of the additional transistors.

11. The circuit of claim 1, wherein the differential amplifier further includes a first load coupled to the drain of the first FET transistor and a second load coupled to the drain of the second FET transistor and wherein the first and second loads are configured to be matched.

12. The circuit of claim 1, wherein the body bias signal is between 400 and 500 millivolts.

13. A circuit comprising:
    a differential amplifier in an integrated circuit having a minimum line width Lmin, the differential amplifier including
    (a) input conductors to carrying input voltage signals;
    (b) output conductors to carrying output voltage signals;
    (c) a differential pair of first and second FET transistors coupled to the input and output conductors to receive the input voltage signals and at least partially control the output voltage signals as a function of the input voltage signals, the first and second FET transistors having a body and being configured to be matched, the first and second FET transistors each having a channel length that is between Lmin and 2 Lmin, where Lmin is a minimum line width for the input and output conductors; and body bias control circuitry to provide a body bias voltage signal to the body to place the first and second FET transistors in a forward body bias condition.

14. The circuit of claim 13, wherein the channel lengths are between Lmin and 1.5 Lmin.

15. The circuit of claim 13, wherein the channel lengths are between Lmin and 1.25 Lmin.

16. A circuit comprising:
    a sense amplifier including:
    (a) a differential amplifier including a differential pair of first and second FET transistors to at least partially control output voltage signals responsive to input voltage signals on input conductors, the first and second FET transistors being configured to be matched and having a body; and
    (b) precharge circuitry coupled to the input conductors; and
    body bias control circuitry to provide a body bias voltage signal to the body to place the first and second FET transistors in a forward body bias condition such that the first and second FET transistors are better matched and offset voltage of the differential amplifier is reduced as compared to the matching and offset voltage at zero body bias;
    body bias control circuitry to provide a body bias voltage signal to the body to place the first and second FET transistors in a forward body bias condition.

17. The circuit of claim 16, wherein with the forward body bias applied the first and second FET transistors are better matched and an offset voltage of the differential amplifier is reduced as compared to the matching and offset voltage that would exist with a zero body bias.

18. A circuit comprising:
    a differential voltage control oscillator including differential amplifier stages each including a differential amplifier including a differential pair of first and second FET transistors to at least partially control output voltage signals responsive to input voltage signals on input conductors, the first and second FET transistors being configured to be matched and the differential pairs having a body; and body bias control circuitry to provide a body bias voltage signal to the body of at least some of the differential amplifier stages to place the first and second FET transistors of those stages in a forward body bias condition; and voltage control circuitry to provide a voltage control circuitry to at least some of the differential amplifier stages.

19. The circuit of claim 18, wherein with the forward body bias applied the first and second FET transistors are better matched and an offset voltage of the differential amplifier is reduced as compared to the matching and offset voltage that would exist with a zero body bias.

20. The circuit of claim 18, wherein there are an odd number of differential amplifier stages.

21. The circuit of claim 18, wherein there are an even number of differential amplifier stages.

22. A circuit comprising:

a differential delay locked loop including differential amplifier stages each including a differential amplifier including a differential pair of first and second FET transistors to at least partially control output voltage signals responsive to input voltage signals on input conductors, the first and second FET transistors being configured to be matched and the differential pairs having a body; and body bias control circuitry to provide a body bias voltage signal to the body of at least some of the differential amplifier stages to place the first and second FET transistors of those stages in a forward body bias condition; and voltage control circuitry to provide a voltage control circuitry to at least some of the differential amplifier stages.

23. The circuit of claim 22, wherein with the forward body bias applied the first and second FET transistors are better matched and an offset voltage of the differential amplifier is reduced as compared to the matching and offset voltage that would exist with a zero body bias.

24. The circuit of claim 22, wherein there are an odd number of differential amplifier stages.

25. The circuit of claim 22, wherein there are an even number of differential amplifier stages.

26. The circuit of claim 22, further comprising phase detector circuitry having an output and wherein the body bias control is controlled by the output signal.

27. A circuit comprising:

a differential phase locked loop including differential amplifier stages each including a differential amplifier including a differential pair of first and second FET transistors to at least partially control output voltage signals responsive to input voltage signals on input conductors, the first and second FET transistors being configured to be matched and the differential pairs having a body; and body bias control circuitry to provide a body bias voltage signal to the body of at least some of the differential amplifier stages to place the first and second FET transistors of those stages in a forward body bias condition; and voltage control circuitry to provide a voltage control circuitry to at least some of the differential amplifier stages.

28. The circuit of claim 27, wherein with the forward body bias applied the first and second FET transistors are better matched and an offset voltage of the differential amplifier is reduced as compared to the matching and offset voltage that would exist with a zero body bias.

29. The circuit of claim 27, wherein there are an even number of differential amplifier stages.

30. The circuit of claim 27, further comprising phase detector circuitry having an output and wherein the body bias control is controlled by the output signal.

* * * * *